United States Patent
Busick et al.

Patent Number: 6,119,462
Date of Patent: Sep. 19, 2000

[54] WATER COOLER WITH IMPROVED THERMOELECTRIC CHILLER SYSTEM

[75] Inventors: Louis M. Busick, Columbus, Ohio; Bruce D. Burrows, Valencia, Calif.

[73] Assignee: Oasis Corporation, Columbus, Ohio

[21] Appl. No.: 09/273,807

[22] Filed: Mar. 22, 1999

Related U.S. Application Data

[60] Provisional application No. 60/078,960, Mar. 23, 1998.

[51] Int. Cl.[7] .................................................. F25B 21/02
[52] U.S. Cl. .............................................. 62/3.64; 62/3.3
[58] Field of Search ....................................... 62/3.64, 3.3

[56] References Cited

U.S. PATENT DOCUMENTS

| | | |
|---|---|---|
| 3,008,299 | 11/1961 | Sheckler . |
| 3,008,300 | 11/1961 | Ryan et al. . |
| 3,088,289 | 5/1963 | Alex . |
| 3,243,965 | 4/1966 | Jepson . |
| 3,250,433 | 5/1966 | Christine et al. . |
| 3,270,513 | 9/1966 | Ter Bush . |
| 3,327,485 | 6/1967 | Ter Bush . |
| 3,445,039 | 5/1969 | Brodsky et al. . |
| 4,055,053 | 10/1977 | Elfving et al. ................................. 62/3 |
| 4,476,690 | 10/1984 | Iannelli . |
| 4,487,619 | 12/1984 | Jones . |
| 4,612,772 | 9/1986 | Jones . |
| 4,662,180 | 5/1987 | Menocal . |
| 4,745,759 | 5/1988 | Bauer et al. . |
| 4,752,389 | 6/1988 | Burrows . |
| 4,843,830 | 7/1989 | Haul . |
| 4,866,945 | 9/1989 | Bender et al. ........................... 62/3.61 |
| 4,880,535 | 11/1989 | Burrows . |
| 4,913,713 | 4/1990 | Bender et al. ........................... 62/3.61 |
| 4,996,847 | 3/1991 | Zickler ..................................... 62/3.64 |
| 5,072,590 | 12/1991 | Burrows . |
| 5,209,069 | 5/1993 | Newnan ................................... 62/3.64 |
| 5,285,718 | 2/1994 | Webster et al. ............................ 99/290 |
| 5,367,879 | 11/1994 | Doke et al. ................................. 62/3.6 |
| 5,469,708 | 11/1995 | Harrison et al. ........................... 62/3.64 |
| 5,501,077 | 3/1996 | Davis et al. . |
| 5,513,495 | 5/1996 | West et al. . |
| 5,544,489 | 8/1996 | Moren . |
| 5,560,211 | 10/1996 | Parker . |
| 5,619,856 | 4/1997 | Lee ........................................... 62/3.64 |
| 5,627,310 | 5/1997 | Johnson . |
| 5,699,669 | 12/1997 | Gebhard ................................... 62/3.64 |
| 5,860,280 | 1/1999 | Recine, Sr. et al. ...................... 62/3.64 |
| 5,868,944 | 2/1999 | Wright et al. ............................. 210/758 |
| 6,003,318 | 12/1999 | Busick et al. ............................. 62/3.64 |

FOREIGN PATENT DOCUMENTS 1.538.719  9/1968  France .

*Primary Examiner*—William Doerrler
*Assistant Examiner*—Mark Shulman
*Attorney, Agent, or Firm*—Kelly Bauersfeld Lowry & Kelley, LLP

[57] ABSTRACT

A water cooler is provided with an improved chiller system of the type having a thermoelectric chiller module for maintaining a supply of water at a reduced and refreshing temperature level. The chiller system comprises the thermoelectric chiller module having a cold side thereof in thermal communication with a supply of water to be chilled, and a hot side thereof exposed within a manifold defining a heat transfer chamber filled with a heat exchange medium such as water. An impeller located centrally within the heat transfer chamber circulates the water directly against the hot side of the thermoelectric module, from which the water then flows radially outwardly through a plurality of hollow fin elements and is recirculated back to the impeller. In the preferred form, the impeller is coupled by a hermetically sealed magnetic coupling to an air flow fan disposed outside the manifold for providing a cooling air flow over exterior surfaces of the hollow fin elements.

23 Claims, 3 Drawing Sheets

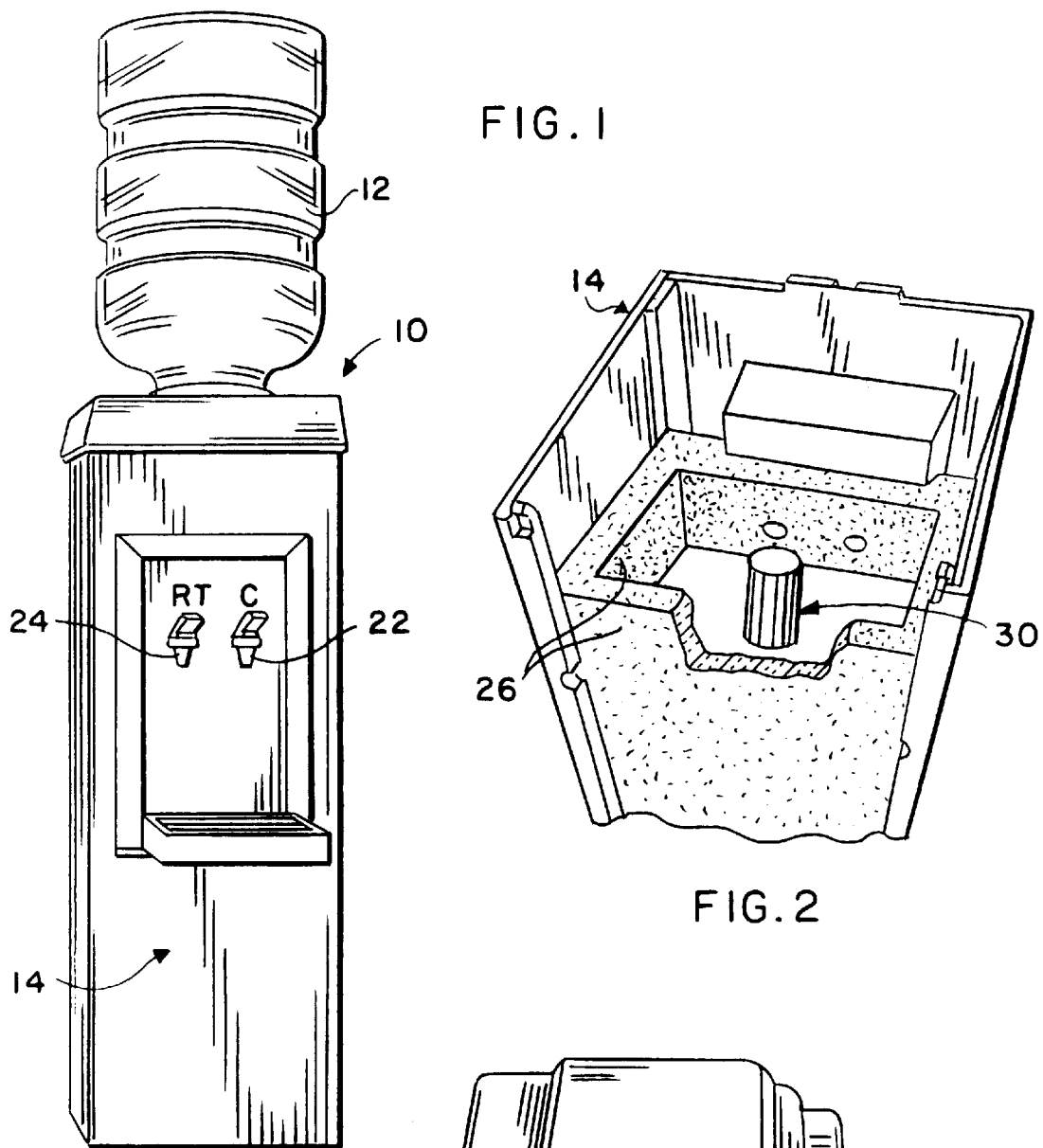

WATER COOLER WITH IMPROVED THERMOELECTRIC CHILLER SYSTEM

This Appln. claims benefit of provisional Appln. 60/078,960 Mar. 23, 1998.

BACKGROUND OF THE INVENTION

This invention relates generally to improvements in refrigeration or chiller systems used to cool a supply of water in a water cooler or the like. More specifically, this invention relates to an improved chiller system of the type using a thermoelectric heat transfer module, particularly with respect to an improved arrangement for transferring and dissipating heat from a hot side of the thermoelectric module.

Water coolers are well known in the art for containing a supply of relatively purified water in a convenient manner and location ready for substantially immediate dispensing and use. In one common form, such water coolers include an upwardly open reservoir mounted on a cooler housing and adapted to receive and support an inverted water bottle of typically three to five gallon capacity. Water within the inverted bottle flows downwardly into the reservoir for selective dispensing therefrom through one or more faucet valves mounted on the front of the cooler housing. In another common form, the water cooler includes purification elements such as one or more water filters and/or a reverse osmosis purification unit by which relatively purified water is produced and supplied to a water reservoir mounted on the cooler housing for selective dispensing via a faucet valve or the like. In either case, such water coolers are widely used to provide a clean and safe source of water for drinking and cooking, especially in areas where the local water supply contains or is suspected to contain undesired levels of contaminants.

In many water coolers, it is desirable to refrigerate the water within the cooler reservoir to a relatively low temperature to provide a highly pleasing and refreshing source of drinking water. However, refrigeration equipment for such water coolers has normally included conventional mechanical refrigeration apparatus which undesirably increases the overall size, cost, complexity, operational noise level, and power consumption requirements of the water cooler. Alternative cooling system proposals have suggested the use of relatively compact thermoelectric heat transfer cooling modules, but these proposals have generally failed to provide adequate heat transfer from such modules in a simple and cost-efficient arrangement. Instead, heat transfer from the thermoelectric module has either been inadequate to correspondingly result in inadequate water chilling, or complex circulatory fluid cooling networks and/or large heat sinks and large cooling fans have been required.

There exists, therefore, a significant need for further improvements in thermoelectric chiller systems for use with water coolers, wherein a simple and relatively low cost cooling arrangement is provided for high efficiency transfer of heat from a thermoelectric chiller module. The present invention fulfills these needs and provides further related advantages.

SUMMARY OF THE INVENTION

In accordance with the invention, an improved water chilling system is provided for cooling a water supply contained within a storage reservoir of a water cooler. The chilling system comprises a thermoelectric chiller module mounted on a cooler housing with a cold side thereof oriented for chilling water within the reservoir. A hot side of the thermoelectric module is exposed within a heat transfer chamber defined by a manifold mounted on the cooler housing and filled with a heat transfer medium such as water. The manifold supports an impeller for circulating the water therein directly against the module hot side for high-efficiency heat transfer therewith. From the module, the water flows outwardly and through a plurality of fin elements, and then recirculates back to the impeller.

The manifold comprises a generally shell-shaped structure adapted for mounting onto the water cooler housing in a manner covering the hot side of the thermoelectric chiller module and thus cooperating therewith to define the heat transfer chamber. The impeller is mounted centrally on the manifold and is oriented in close proximity to the module hot side for delivering the heat transfer medium into direct contact therewith and with a flow velocity generally perpendicular to the plane of the module hot side. From the module, the water flows radially outwardly and then passes down and through the fin elements defined by the manifold, and returns to the impeller for recirculation.

The impeller is rotatably driven in tandem with an air flow fan mounted externally of the manifold for circulating air over the exterior surfaces of the fin elements, thereby carrying heat from the manifold. In the preferred form, the impeller is rotatably coupled with the air flow fan by a hermetically sealed magnetic coupling.

Other features and advantages of the present invention will become more apparent from the following detailed description, taken in conjunction with the accompanying drawings which illustrate, by way of example, the principles of the invention.

BRIEF DESCRIPTION OF THE DRAWINGS

The accompanying drawings illustrate the invention. In such drawings:

FIG. 1 is a front perspective view illustrating a water cooler adapted for use with the improved thermoelectric chiller system embodying the novel features of the invention;

FIG. 2 is an enlarged rear perspective view of the water cooler of FIG. 1, with a water storage reservoir removed therefrom;

FIG. 3 is an enlarged bottom perspective view depicting one preferred form of the water storage reservoir;

DETAILED DESCRIPTION OF THE PREFERRED EMBODIMENT

Figure 4:
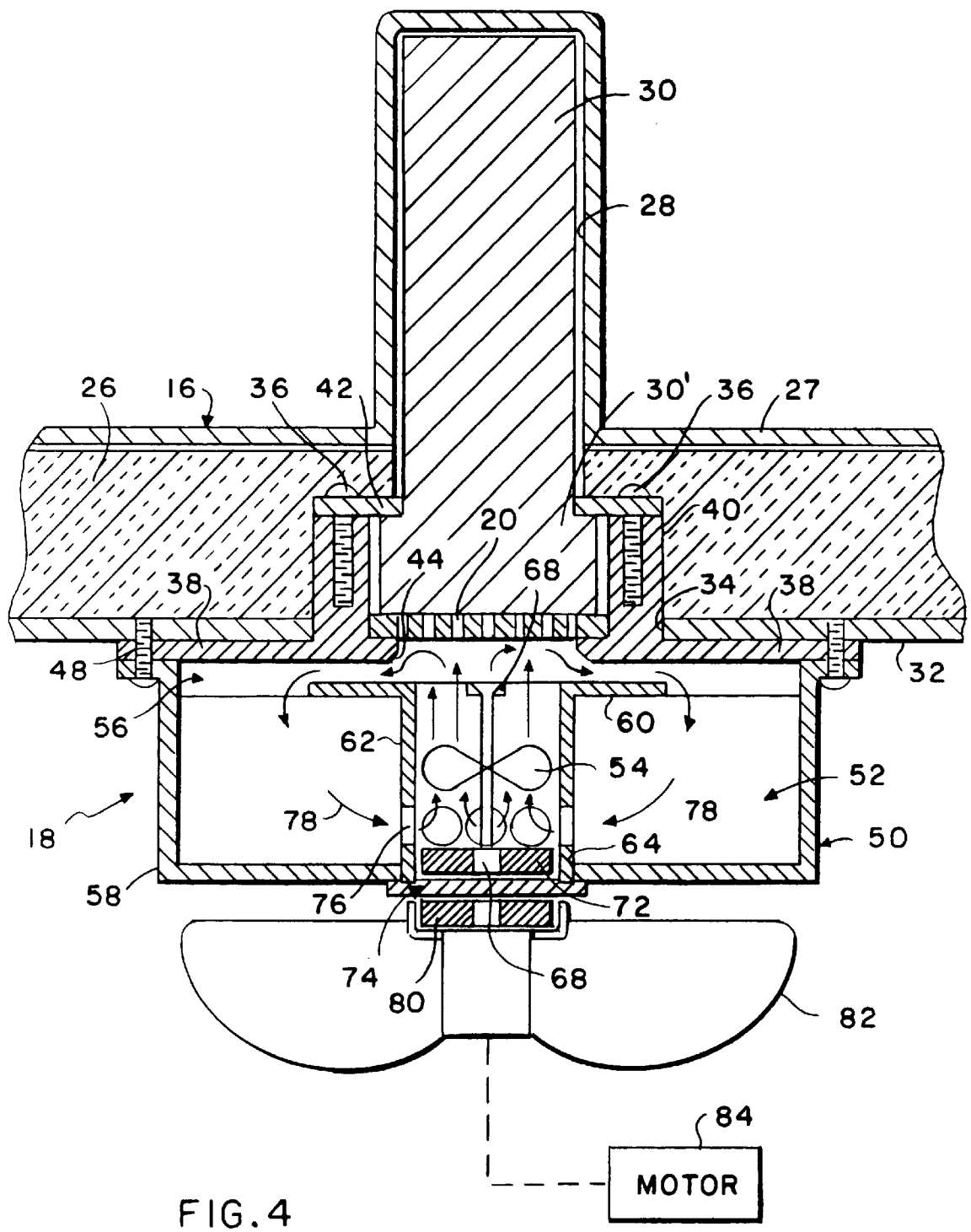
FIG. 4 is an enlarged and fragmented sectional view showing the improved chiller system of the present invention installed within the water cooler.

As shown in the exemplary drawings, a water cooler referred to generally in FIG. 1 by the reference numeral 10 is provided for receiving and storing a supply of relatively purified water for drinking and cooking use, etc. The illustrative cooler 10 is of the type adapted for supporting a water bottle 12 in an inverted position on a cooler housing 14, to provide the source of water for downflow into a housing reservoir 16 (FIGS. 3 and 4). A chiller system 18 (FIG. 4) is mounted within the cooler housing 14 and includes a thermoelectric heat transfer chiller module 20 for reducing the temperature level of water contained within the reservoir 16. In accordance with the invention, the chiller system 18 further includes an improved heat transfer arrangement for transferring heat from a hot side of the chiller module 20, to result in relatively simple and compact yet highly efficient refrigeration of the water.

The illustrative bottled water cooler 10 has a generally conventional overall size and shape to include the upstanding cabinet or housing 14 adapted to support the reservoir 16 which is upwardly open for receiving water downflow from the inverted water bottle 12. The housing 14 supports the water bottle 12 in the inverted orientation as shown, such that the water contained therein will flow by gravity into the reservoir until the reservoir water level rises sufficiently to cover the mouth of the inverted bottle. One or more faucet valves are mounted on the housing 14 and/or directly on the reservoir 16 for use in dispensing water from the reservoir, with two faucets 22 and 24 being shown by way of example in FIGS. 1 and 3. Water dispensing from the reservoir results in a lowering of the reservoir water level sufficiently to uncover the bottle mouth and permit additional make-up water to flow downwardly from the bottle to the reservoir.

The reservoir 16 is depicted to be of the removable type for quick and easy lift-out removal from and correspondingly quick and easy drop-in placement into the cooler housing 14. More particularly, as shown best in FIGS. 2 and 3, the reservoir 16 may be constructed from molded plastic or the like to provide a self-contained water vessel having a size and shape for drop-in or slide-fit reception into the upper end of the cooler housing, to fit relatively closely within an upwardly open insulation shell 26. In a preferred form, a bottom wall 27 of the reservoir 16 has an upwardly extending inverted receiver cup 28 (FIG. 3) formed therein for slide-fit reception of a chiller probe 30 (FIG. 2) upstanding within the insulation shell 26. The chiller probe 30 comprises a heat transfer member of relatively high thermal conductivity and functions, as will be described in more detail, as a cold source for chilling water contained within the reservoir 16. For more detail regarding the specific construction of a removable reservoir type bottled water cooler, see U.S. Pat. Nos. 5,192,004; 5,289,951; 5,370,276; 5,395,014; and 5,449,093, which are incorporated by reference herein. Moreover, while the invention is shown and described by reference to a bottle-type water cooler, persons skilled in the art will recognize and understand that the invention may be applied to other style water coolers, such as point-of-use coolers of the type using water filtration and/or reverse osmosis purification devices.

FIG. 4 shows the cooler reservoir 16 installed into the cooler housing, with a reservoir bottom wall 27 resting upon the corresponding bottom wall of the insulation shell 26. The insulation shell 26 is supported in turn upon a generally horizontal platform 32 forming a part of an internal frame of the cooler housing 14. The chiller probe 30 is shown to extend upwardly through a central aperture 34 in the platform 32 and the insulation shell, for reception into the inverted receiver cup 28 at the bottom of the reservoir.

The chiller probe 30 is secured by screws 36 or the like to a mounting plate 38, which is adapted in turn for attachment to the housing platform 32. More specifically, the chiller probe 30 includes a radially enlarged lower base 30' seated within a central cylindrical collar 40 extending upwardly from the mounting plate 38. An upper retaining ring 42 is anchored by the screws 36 to retain the probe base 30' seated firmly upon a cold side of the thermoelectric chiller module 20, wherein the module 20 is in turn firmly seated upon a short flange 44 radiating inwardly at a lower end of the collar 40. Importantly, the geometry of the components permits the chiller probe base 30' to be retained against the module cold side with a selected compression force to achieve efficient heat transfer therebetween, thereby effectively mounting the cold side of the module in thermal communication with the water supply within the reservoir. The mounting plate 38 extends radially outwardly at a lower end of the collar 40, and is attached to the housing platform 32 by additional screws 48 or the like.

The thermoelectric chiller module 20 comprises a compact solid state heat transfer element having the upper cold side abutting the chiller probe 30, and a lower hot side exposed through the open collar 40 and the platform aperture 34 to the underside of the housing platform 32. An exemplary chiller module 20 is available from Borg-Warner Corporation under Model No. 920-31, and employs semiconductor materials with dissimilar characteristics (P-type and N-type materials) electrically connected in series and thermally in parallel. The module 20 operates to draw or extract thermal energy from the water within the reservoir 16, via the chiller probe 30, and to transfer the extracted heat energy to the lower hot side of the module for dissipation.

The chiller system 18 of the present invention further includes a generally shell-shaped manifold 50 mounted onto the mounting plate 38 by means of the screws 48. The manifold 50 cooperates with the mounting plate 38 to define a closed heat transfer chamber 52 located directly beneath the chiller module 20 and filled with a heat transfer medium such as water in direct contact with the hot side of the module. An impeller 54 is centrally mounted within the heat transfer chamber 52 and is rotatably driven to cause the heat transfer medium to flow directly and substantially perpendicularly against the hot side of the chiller module, resulting in a high rate of heat transfer between the cooling water and the module hot side.

From the module hot side, the cooling water flows radially outwardly within a disk-shaped zone 56 of relatively narrow height within an upper region of the manifold heat transfer chamber 52. The cooling water then passes downwardly into a plurality of radially extending fin elements 58 formed in the manifold 50 for return flow to the impeller 54. A flow control ring 60 may optionally be provided at the upper and radially inner marginal edges of the fin elements 58 to insure water flow radially outwardly to outer regions of the fin elements before flowing downwardly therethrough. With this geometry, the cooling water is circulated through a closed loop path within the heat transfer chamber 52, with efficient heat pick-up from the hot side of the chiller module 20 and efficient heat transfer in turn to the extended surface areas defined by the fin elements 58 (FIGS. 4 and 5).

Figure 5:
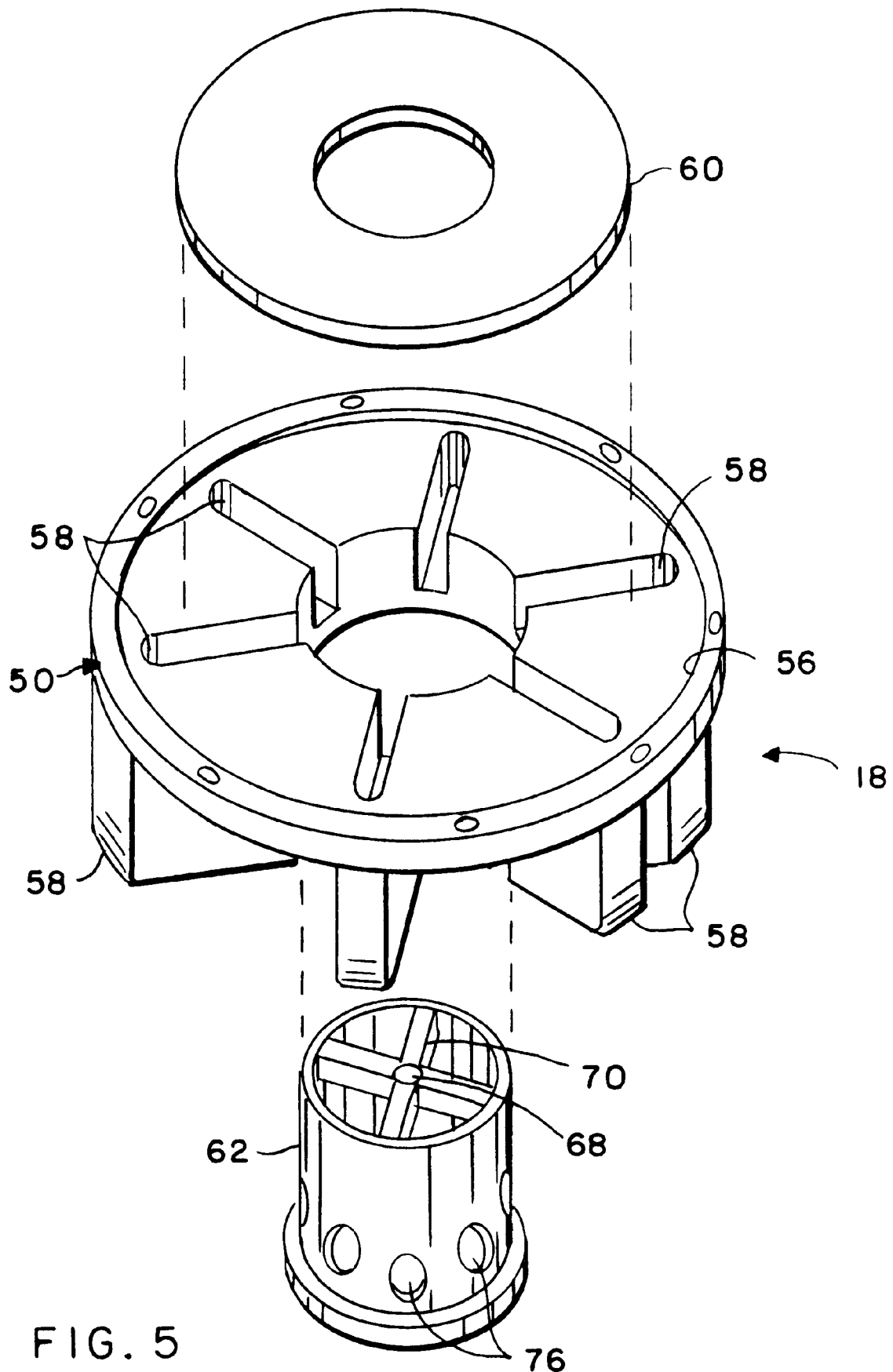
FIG. 5 is an exploded perspective view illustrating assembly of chiller system components.

The impeller 54 is conveniently mounted within a generally cup-shaped housing member 62 mounted generally centrally within the manifold 50, as shown best in FIGS. 4 and 5. In this regard, the cup-shaped impeller housing 62 is adapted for sealed mounting within a central port 64 formed in the manifold. The impeller housing 62 has a closed lower end, and an open upper end exposed to and closely underlying the hot side of the module 20. The impeller 54 is supported within the housing 62 on a rotary shaft 66 having opposite ends carried in suitable bearings 68. The bearing 68 at the upper end is supported in an open web 70 to permit water flow upwardly from the impeller housing to the chiller module, and the bearing 68 at the lower end is supported in a driven member 72 of a hermetically sealed magnetic coupling 74. A plurality of radially open intake ports 76 are formed in the impeller housing 62 in alignment respectively with the plural fin elements 58 for recirculatory water inflow as indicated by arrows 78 in FIG. 4.

A drive member 80 of the magnetic coupling 74 is carried at the underside of the impeller housing 62, coaxial with an air flow fan 82 mounted for rotation therewith. In operation, the air flow fan 82 is rotatably driven by a motor 84 shown schematically in FIG. 4 for circulating cooling air over the exterior surfaces of the fin elements 58 formed on the manifold 50. At the same time, the magnetic coupling 74 is rotatably driven by the fan 82 to correspondingly drive the impeller 54 for circulation of the cooling water within the manifold heat transfer chamber 52. The combined result of the direct water flow against the module hot side, together with the circulation of the cooling water and cooling air respectively over the interior and exterior surfaces of the fin elements 58 provides a high efficiency heat transfer in a relatively simple and hermetically sealed chiller system.

A variety of further modification and improvements in and to the chiller system will be apparent to those persons skilled in the art. Accordingly, no limitation on the invention is intended by way of the foregoing description and accompanying drawings, except as set forth in the appended claims.

What is claimed is:

1. A water chilling system for chilling a supply of water within a storage reservoir of a water cooler or the like, said system comprising:

a thermoelectric heat transfer module having a hot side and a cold side, and means for transferring thermal energy from said cold side to said hot side;

means for mounting said module with said cold side in thermal communication with a supply of water within a reservoir;

a manifold mounted over said module and defining a heat transfer chamber having a fluid heat transfer medium therein in direct contact with said hot side of said module, said manifold further including a plurality of outwardly projecting fin elements; and means within said heat transfer chamber for circulating the fluid heat transfer medium along a closed loop path against said hot side of said module and further into heat exchange relation with said fin elements whereby heat energy from said module hot side is transferred by the fluid heat transfer medium to said fin elements.

2. The water chilling system of claim 1 wherein said fluid heat transfer medium comprises a liquid medium.

3. The water chilling system of claim 1 wherein said fluid heat transfer medium comprises water.

4. The water chilling system of claim 1 further including a chiller probe mounted in thermal communication between said cold side of said module and the water supply.

5. The water chilling system of claim 4 including means for mounting said cold side of said module against said chiller probe with a selected compression force.

6. The water chilling system of claim 1 wherein said module mounting means comprises means for mounting said module on a cooler frame member, said manifold comprising a generally shell-shaped component mounted onto said frame member and cooperating therewith to define said heat transfer chamber.

7. The water chilling system of claim 1 wherein said circulating means comprises an impeller for circulating the fluid heat transfer medium with a direction of flow generally perpendicularly against said hot side of said module.

8. The water chilling system of claim 1 wherein said fin elements are internally hollow and radiate outwardly from said circulating means.

9. The water chilling system of claim 8 further including fan means for circulating air flow over the exterior of said hollow fin elements.

10. The water chilling system of claim 9 including common motor means for driving said fan means and said circulating means within said heat transfer chamber.

11. The water chilling system of claim 10 including a hermetically sealed magnetic coupling connected between said fan means and said circulating means.

12. The water chilling system of claim 8 wherein said circulating means comprises an impeller housing mounted within said heat transfer chamber, said impeller housing having an impeller mounted therein for circulating the fluid heat transfer medium with a direction of flow generally perpendicularly against said hot side of said module, said impeller housing further cooperating with said manifold to define said closed loop path for circulation of the fluid heat transfer medium radially outwardly from said module hot side and through said hollow fin elements for return flow to said impeller.

13. A water chilling system for chilling a supply of water within a storage reservoir of a water cooler or the like, said system comprising:

a thermoelectric heat transfer module having a hot side and a cold side, and means for transferring thermal energy from said cold side to said hot side;

means for mounting said module with said cold side in thermal communication with a supply of water within a reservoir;

a manifold mounted over said module and defining a heat transfer chamber having a liquid heat transfer medium therein in thermal communication with said hot side of said module, said manifold further including a plurality of outwardly projecting fin elements; and means within said heat transfer chamber for circulating the fluid heat transfer medium along a closed loop path with a direction of flow generally perpendicularly against said hot side of said module and further into heat exchange relation with said fin elements whereby heat energy from said module hot side is transferred by the fluid heat transfer medium to said fin elements.

14. The water chilling system of claim 13 wherein said heat transfer medium comprises water.

15. The water chilling system of claim 13 further including a chiller probe mounted in thermal communication between said cold side of said module and the water supply.

16. The water chilling system of claim 14 including means for mounting said cold side of said module against said chiller probe with a selected compression force.

17. The water chilling system of claim 13 wherein said module mounting means comprises means for mounting said module on a cooler frame member, said manifold comprising a generally shell-shaped component mounted onto said frame member and cooperating therewith to define said heat transfer chamber.

18. The water chilling system of claim 13 wherein said hot side of said module is exposed within said heat transfer chamber to direct contact with said heat transfer medium.

19. The water chilling system of claim 13 wherein said fin elements are internally hollow and radiate outwardly from said circulating means.

20. The water chilling system of claim 19 further including fan means for circulating air flow over the exterior of said hollow fin elements.

21. The water chilling system of claim 20 including common motor means for driving said fan means and said circulating means within said heat transfer chamber.

22. The water chilling system of claim 21 including a hermetically sealed magnetic coupling connected between said fan means and said circulating means.

23. The water chilling system of claim 19 wherein said circulating means comprises an impeller housing mounted within said heat transfer chamber, said impeller housing having an impeller mounted therein for circulating the fluid heat transfer medium with a direction of flow generally perpendicularly against said hot side of said module, said impeller housing further cooperating with said manifold to define said closed loop path for circulation of the fluid heat transfer medium radially outwardly from said module hot side and through said hollow fin elements for return flow to said impeller.

* * * * *